United States Patent
Degani et al.

(10) Patent No.: US 9,137,084 B2
(45) Date of Patent: Sep. 15, 2015

(54) DIGITALLY CONTROLLED EDGE INTERPOLATOR (DCEI) FOR DIGITAL TO TIME CONVERTERS (DTC)

(71) Applicant: Intel Corporation, Santa Clara, CA (US)

(72) Inventors: Ofir Degani, Haifa (IL); Rotem Banin, Carmey-yosef (IL); Ashoke Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/958,295

(22) Filed: Aug. 2, 2013

(65) Prior Publication Data

US 2015/0036767 A1 Feb. 5, 2015

(51) Int. Cl.
*H04L 27/36* (2006.01)
*H03F 1/02* (2006.01)
*H03F 3/217* (2006.01)
*H03F 3/24* (2006.01)

(52) U.S. Cl.
CPC .............. *H04L 27/36* (2013.01); *H03F 1/0216* (2013.01); *H03F 3/2175* (2013.01); *H03F 3/245* (2013.01)

(58) Field of Classification Search
USPC .......................................... 375/298, 300, 308
See application file for complete search history.

(56) References Cited

U.S. PATENT DOCUMENTS

| 8,390,349 B1 | 3/2013 | Ravi et al. |
| 2005/0140416 A1 | 6/2005 | Rashid |
| 2008/0026706 A1 | 1/2008 | Shimizu et al. |
| 2009/0289676 A1 * | 11/2009 | Takai ............................. 327/158 |
| 2010/0060334 A1 | 3/2010 | Abe et al. |
| 2011/0267120 A1 | 11/2011 | Ravi et al. |
| 2012/0062331 A1 | 3/2012 | Ravi et al. |
| 2014/0266822 A1 * | 9/2014 | Henzler et al. ................. 341/118 |

FOREIGN PATENT DOCUMENTS

EP 2833548 A2 2/2015

OTHER PUBLICATIONS

Jung et al., "A CMOS Low-Power Digital Polar Modulator System Integration for WCDMA Transmitter", IEEE Transactions on Industrial Electronics, 2011, 8 Pages.
Extended European search report received for European Patent Application No. 14177406.7, mailed on Feb. 2, 2015, 5 pages.

* cited by examiner

*Primary Examiner* — Kabir A Timory
(74) *Attorney, Agent, or Firm* — Alpine Technology Law Group LLC (57) ABSTRACT

A Digital-to-Time (DTC) for a Digital Polar Transmitter (DPT) comprises a coarse delay/phase segment and a fine delay/phase segment. The coarse delay/phase segment generates an even delay/phase signal and an odd delay/phase signal. The fine/phase delay segment receives the even coarse phase signal and the odd coarse phase signal, and is responsive to a fine delay/phase control signal to generate a fine delay/phase output signal that is an interpolation of the even delay/phase signal and the odd delay/phase signal. In one exemplary embodiment, the fine delay/phase control signal comprises a binary signal having $2^N$ values, and the fine delay/phase segment comprises $2^N$ interpolators. Each interpolator is coupled to the even and odd coarse phase signals and is controlled by the fine delay/phase control signal to be responsive to the even coarse phase signal or the odd coarse phase signal based on a value of the fine delay/phase control signal.

25 Claims, 11 Drawing Sheets

FIG. 10

DIGITALLY CONTROLLED EDGE INTERPOLATOR (DCEI) FOR DIGITAL TO TIME CONVERTERS (DTC)

TECHNICAL FIELD

Embodiments of systems and techniques described herein relate to Digital Polar Transmitters (DPTs). More particularly, embodiments of systems and techniques that relate to a Digital-to-Time Converter (DTC) for a DPT that generate fine delay/phase signals that are self-aligned with a coarse delay/phase segment of the DTC.

BACKGROUND

Digital Polar Transmitter (DPTX) architectures provide a reduced size and reduced power consumption in comparison to conventional analog radio transmitter architectures. A DPTX architecture includes two main functional blocks. One main functional block is a Digital-to-Time Converter (DTC) that modulates a local oscillator (LO) carrier with phase information of a signal that is to be transmitted. The other main functional block is a Digital Power Amplifier (DPA) that modulates the amplitude of the signal that is to be transmitted onto the phase-modulated LO signal, thereby generating a reconstruction of the original signal (e.g., the signal to be transmitted).

A major technical challenge for DPTX architectures is to handle the wideband signals that are associated with modern communication protocols, such as IEEE 802.11 ac (commonly referred to as WiFi, and having a signal bandwidth of about 20-160 MHz), and Long Term Evolution (commonly referred to as 4G LTE, and having a signal bandwidth of about 10-40 MHz). These wide bandwidth signals are hard for DPTX architectures to handle because the bandwidths of the separate phase signal and the amplitude signal can respectively be about ten times and about three times greater than the bandwidth of the protocol signal. Another challenge for DPTX architectures comes from co-existence requirements associated with a small form-factor for multi-protocol communications devices in which DPTX are used. In order to avoid desensitizing the receiver of such devices, the noise floor requirements can pose strict constraints on the quantization noise level of the DTC and DPA of the DPTX.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

It will be appreciated that for simplicity and/or clarity of illustration, elements depicted in the figures have not necessarily been drawn to scale. For example, the dimensions of some of the elements may be exaggerated relative to other elements for clarity. The scaling of the figures does not represent precise dimensions and/or dimensional ratios of the various elements depicted herein. Further, if considered appropriate, reference numerals have been repeated among the figures to indicate corresponding and/or analogous elements.

DESCRIPTION OF THE EMBODIMENTS

Embodiments of techniques described herein relate to a Digital-to-Time Converter (DTC) architecture that includes a digitally controlled edge interpolator (DCEI) for generating fine delay/phase signals that are self-aligned with a coarse delay/phase segment and that does not need calibration techniques. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. Additionally, the word "exemplary" is used herein to mean "serving as an example, instance, or illustration." Any embodiment described herein as "exemplary" is not to be construed as necessarily preferred or advantageous over other embodiments. The term "segment" as used herein refers to logic such as, but not limited to, one or more circuit devices and/or software and/or firmware that provides the functionality of the particular segment.

Various operations may be described as multiple discrete operations in turn and in a manner that is most helpful in understanding the claimed subject matter. The order of description, however, should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Embodiments of the subject matter disclosed herein provide a Digital-to-Time Converter (DTC) architecture that includes a digitally controlled edge interpolator (DCEI) for generating fine delay/phase signals that are self-aligned with a coarse delay/phase segment and that does not need calibration techniques. Embodiments of the subject matter disclosed herein provide a system and method for interpolating fine delay/phase steps between adjacent coarse delay/phase steps taps of a coarse segment of a DTC. Additionally, embodiments of the subject matter disclosed herein are frequency independent and provide a true phase interpolation.

In order for a conventional DTC to generate a fine granularity of delays, one approach has been to use a segmented DTC architecture so that an accurate $2\pi$ phase range can be generated for a wide-bandwidth phase-modulated LO signal. One segment generates a coarse delay/phase signal and a second segment generates a fine delay/phase signal from the coarse delay/phase signal. A conventional approach for the fine delay/phase segment is to use a digitally controlled delay line (DCDL) in which the capacitive loads of the delay cells are digitally controlled.

A significant drawback with a conventional segmented DTC approach is, however, that the respective delays of the coarse and fine segments are not necessarily aligned. That is, the delay/phase range of a DCDL of a fine segment is generally not aligned with the individual delays of the coarse delay/phase generating segment. Mismatches between the individual coarse delays are caused by, for example, fabrication process variations. To compensate for the individual coarse delays, a DCDL must provide a delay range that overlaps (e.g., is longer than) the largest individual Least Significant Bit (LSB) delay of the coarse delay/phase generating segment. Accordingly, the delay misalignment between the fine delay/phase generating segment and the coarse delay/phase generating segment requires an elaborate initial calibration technique and a comprehensive Look-up Table (LUT) to store the calibration adjustments so that the DCDL delay range is adaptable to each coarse delay step. Additionally, the calibration must be repeated during "silent" times (e.g., times of no TX or RX) to correct for temperature and voltage operational variations so that non-monotonicity of the generated delay/phase is avoided. Moreover, because the DCDL is a delay-control element and not phase-control element, the calibration needs to be repeated at each operating frequency to match the phase and delay modulations for the various operating frequencies.

Figure 1:
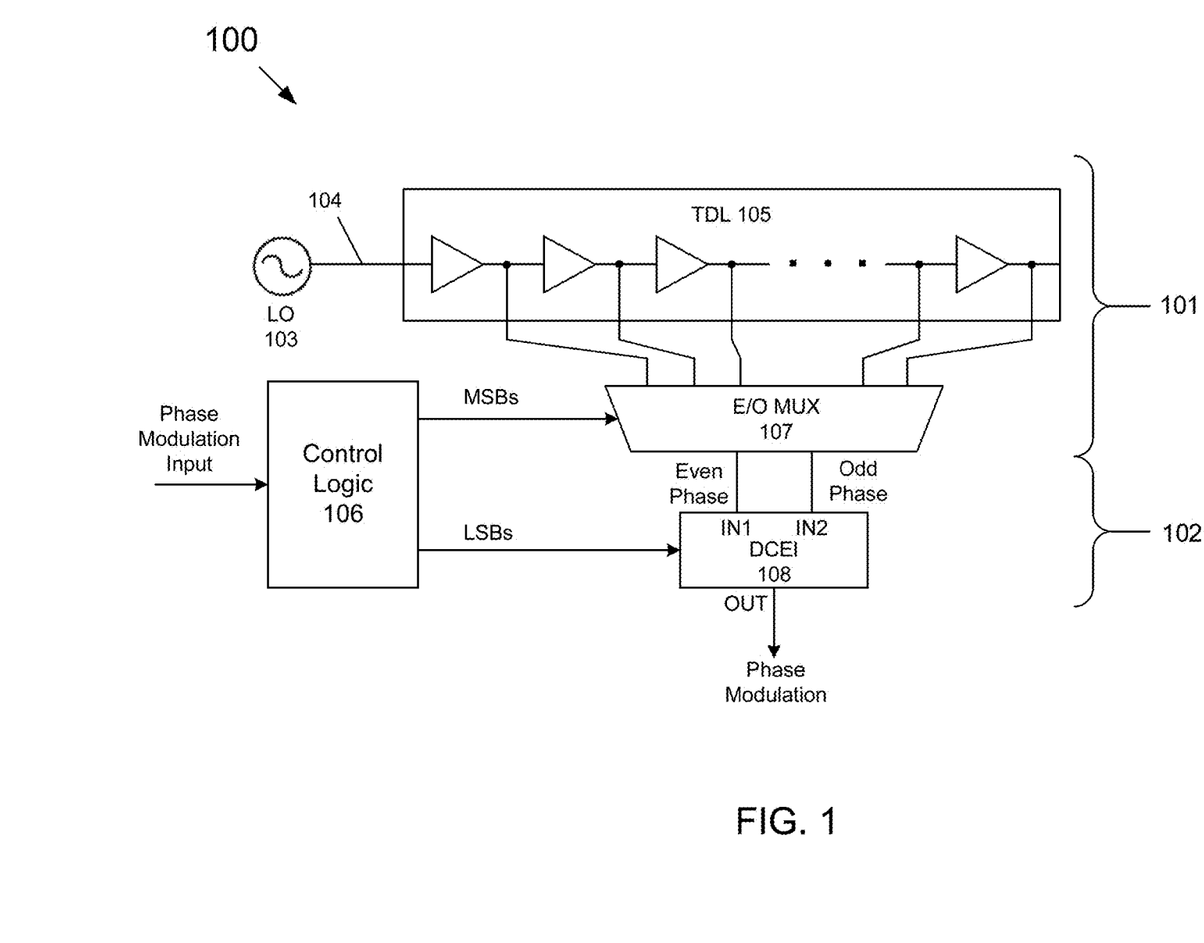
FIG. 1 depicts a functional block diagram of a segmented Digital-to-Time Converter (DTC) according to the subject matter disclosed herein that can be used in conjunction with a Digital Polar Transmitter (DPTX) architecture.

FIG. 1 depicts a functional block diagram of a segmented Digital-to-Time Converter (DTC) 100 according to the subject matter disclosed herein that can be used as part of a Digital Polar Transmitter (DPTX) architecture. DTC 100 includes a coarse-delay generating segment 101 and a fine-delay generating or segment 102. Coarse-delay segment 101 comprises a Tapped Delay Line (TDL) 105, and an Even/Odd Phase Multiplexer (E/O MUX) 107. Fine-delay segment 102 comprises a digitally controlled edge interpolator (DCEI) 108. A local oscillator (LO) 103 outputs an LO signal 104 that is input to TDL 105. A phase-modulation input value that is to be modulated onto LO signal 104 is input to a control logic 106. Control logic 106 processes and separates the phase modulation input value into a group of coarse delay/phase control bits and a group of fine delay/phase control bits. The coarse delay/phase control bits are input to E/O MUX 107 and control the specific even or odd phase signals that are respectively output from the Even Phase Output and from the Odd Phase Output. The Even and Odd Phase Outputs are respectively input to the IN1 and IN2 inputs of DCEI 108. The fine delay/phase control bits output from control logic 106 are input to DCEI 108 and control the interpolation between even and odd phases input to IN1 and IN2 of the fine delay/phase output signal OUT.

Figure 2:
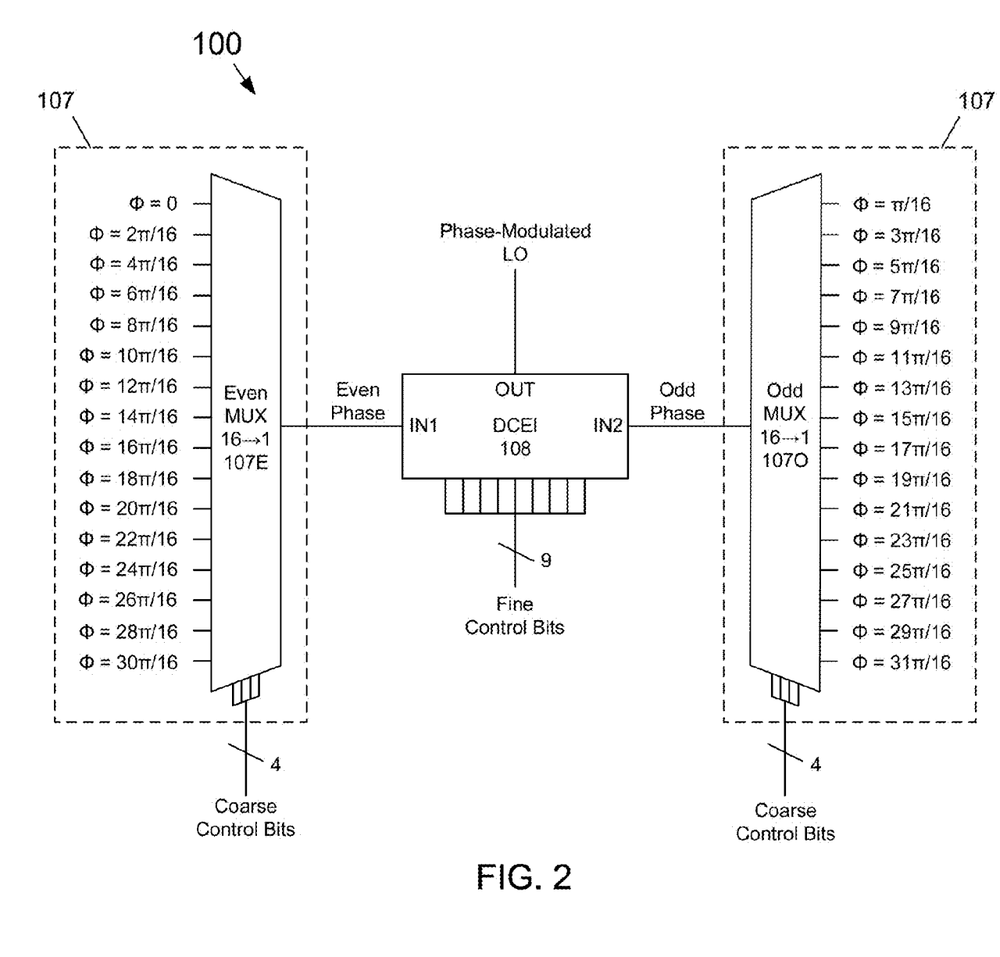
FIG. 2 depicts an exemplary embodiment of functional block diagram of a portion of Digital-to-Time Converter (DTC) according to the subject matter disclosed herein.

FIG. 2 depicts an exemplary embodiment of functional block diagram of a portion of Digital-to-Time Converter (DTC) 100 according to the subject matter disclosed herein. In particular, FIG. 2 depicts an E/O MUX 108 and a DCEI 108 in which the specific exemplary embodiment depicted is configured for five coarse bits of phase control and nine fine bits of phase control. Such an exemplary configuration could be used for an LO signal of, for example, 2.5 GHz (e.g., a 2.5 GHz carrier) in which the five coarse control bits provide a (coarse) LSB resolution of 12.5 ps, and the nine fine control bits provide a (fine) LSB resolution of approximately 25 fs.

E/O MUX 107 is depicted in FIG. 2 as an even phase multiplexer (Even MUX) 107E and an odd phase multiplexer (Odd MUX) 107O. For the exemplary embodiment depicted in FIG. 2, both Even MUX 107E and Odd MUX 107O are 16:1 multiplexers, thereby providing a total of 32 coarse delay/phase steps. In other exemplary embodiments, Even MUX 107E and Odd MUX 107O could generally be K:1 multiplexers in which K is an integer equal to or greater than 2. Together the Even and Odd MUXs provide a total of 2K coarse delay/phase steps.

Even MUX 107E receives even delays/phases that are output from, for example, a 32-tap Tapped Delay Line (TDL) (not shown in FIG. 2). Similarly, Odd MUX 107O receives odd delays/phases that are output from the 32-tap TDL. In particular, Even MUX 107E receives even phases $\phi=0$, $\phi=2\pi/16$, . . . , $\phi=30\pi/16$, and Odd MUX 107O receives odd phases $\phi=\pi/16$, $\phi=3\pi/16$, . . . , $\phi=31\pi/16$. Each phase set (even or odd) differs by one LSB coarse control bit, and is stepped by two LSB coarse control bits. The output of Even MUX is input to an input IN1 of DCEI 202, and the output of Odd MUX is input to an input IN2 of DCEI 108. The fine control bits input to DCEI 108 control the interpolated fine delay/phase output signal OUT of DCEI 108.

Figure 3A:
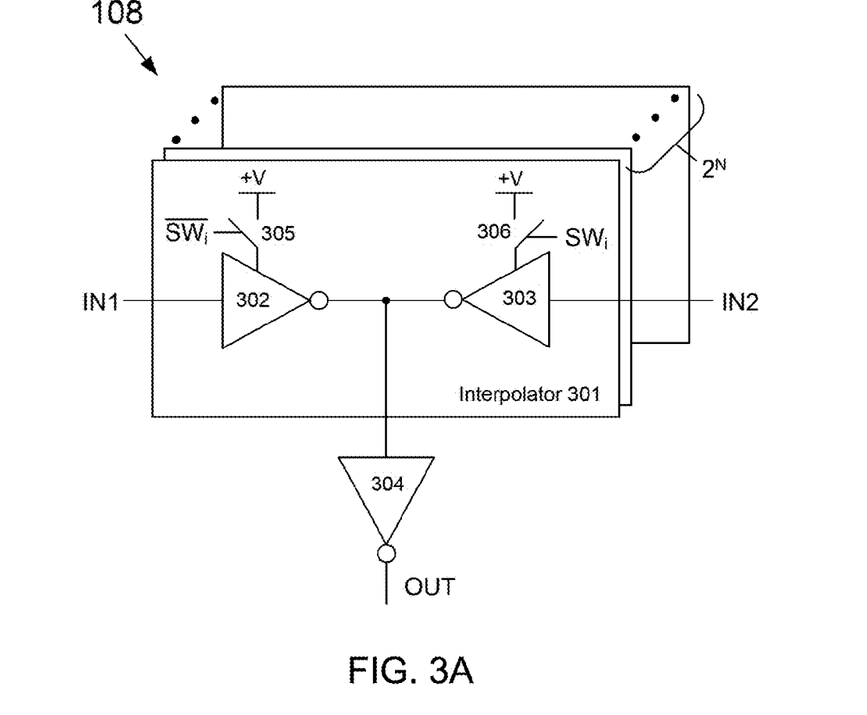
FIG. 3A depicts a functional block diagram of an exemplary embodiment of a DCEI according to the subject matter disclosed herein.

FIG. 3A depicts a functional block diagram of an exemplary embodiment of a DCEI 108 according to the subject matter disclosed herein. DCEI 108 comprises $2^N$ interpolators 301 in which N is an integer equal to or greater than 2. In particular, N is the number of bits that are used to control the interpolated fine delay/phase output from DCEI 108. Each interpolator 301 comprises a first inverter 302 and a second inverter 303. An input IN1 to first inverter 302 is coupled to the output of Even MUX 107E (FIG. 2) and an input IN2 to second inverter 303 is coupled to the output of Odd MUX 107O (FIG. 2). The outputs of inverters 302 and 303 are coupled together and then coupled to the input of a buffer inverter 304. The output of buffer inverter 304 drives the interpolated fine delay/phase output signal OUT (FIG. 2) of DCEI 108. Inverter 302 is also coupled to a power supply voltage +V through a switch 305. Similarly, inverter 303 is coupled to power supply voltage +V through a switch 306. Switches 305 and 306 receive control signals $\overline{SW_i}$ and $SW_i$ and control whether inverters 302 and 303 are responsive to the IN1 and IN2 input signals.

Although inverters 302 and 303 are depicted as being coupled to power supply voltage +V, it should be understood that the subject matter disclosed herein is not so limited and other power supplies and/or grounds could be controlled in a well-known manner to provide the functionality described, in addition to other well-known circuit configurations. It should also be understood that other well-known techniques could be alternatively used for controlling whether inverters 302 and 303 are responsive to the IN1 and IN2 input signals.

According to embodiments of the subject matter disclosed herein, the $2^N$ interpolators 301 of DCEI 108 are coupled in parallel to each other to signals IN1, IN2 and OUT. That is, the IN1 input of each interpolator 301 is coupled to the output of Even MUX 107E and the IN2 input of each interpolator 301 is coupled to the output of Odd MUX 107O. The outputs of all of the inverters 302 and 303 of the interpolators 301 are coupled together and to the input to buffer inverter 304. The output of buffer inverter 304 outputs the interpolated fine delay/phase signal OUT. In an exemplary alternative embodiment, interpolators 301 could be configured as 2:1 multiplexers that selectively pass either IN1 or IN2 depending on the fine control bits applied to the interpolator 301.

In one exemplary embodiment, the fine control bits are decoded and configured to provide pairs of complementary control signals corresponding to each value of the fine control bits. That is, for the exemplary configuration depicted in FIG. 2 in which nine fine control bits are used, there will be $2^9$ pairs of complementary controls signals. Each respective pair of complementary control signals are respectively input to the $\overline{SW_i}$ and $SW_i$ signals of a corresponding interpolator 301. Using a negative logic convention (e.g., a true condition is a low bit signal), if an output bit (or output bit complement) is low, an inverter 302, 303 is coupled to power supply +V and is, therefore, responsive to the corresponding input signal IN1 or IN2. If an output bit (or output bit complement) is high, an inverter 302, 303 is not coupled to power supply +V and is, therefore, unresponsive to the corresponding input signal IN1 or IN2. It should be understood that the subject matter disclosed herein is not so limited and interpolators 301 could be configured for a positive logic arrangement.

If the value M of the fine control bits input to DCEI 108 equals 0, then all of the inverters 302 of the interpolators 301 are responsive to the IN1 input and none of inverters 303 are responsive to the IN2 input. If the value M of the fine control bits input to DCEI 108 is $0<M<2^N$, then a total of M inverters 302 are responsive to the IN1 input and a total of $2^N-M$ inverters 303 are responsive to the IN2 input. If the value M of the fine control bits input to DCEI 108 equals $2^N$, then none of the inverters 302 are responsive to the IN1 input and all of the inverters 303 are responsive to the IN2 input. As long as Δ, which is defined herein to be time delay between signal input to IN1 (e.g., Even Phase) and the signal input to IN2 (e.g., Odd Phase), is greater than the rise and fall times of the respective edges of IN1 and IN2, the location in time of the edges (rising or falling) of the interpolated fine-phase signal OUT will be approximately interpolated with respect to IN1 and IN2 and with a resolution step of Δ/2N.

Figure 3B:
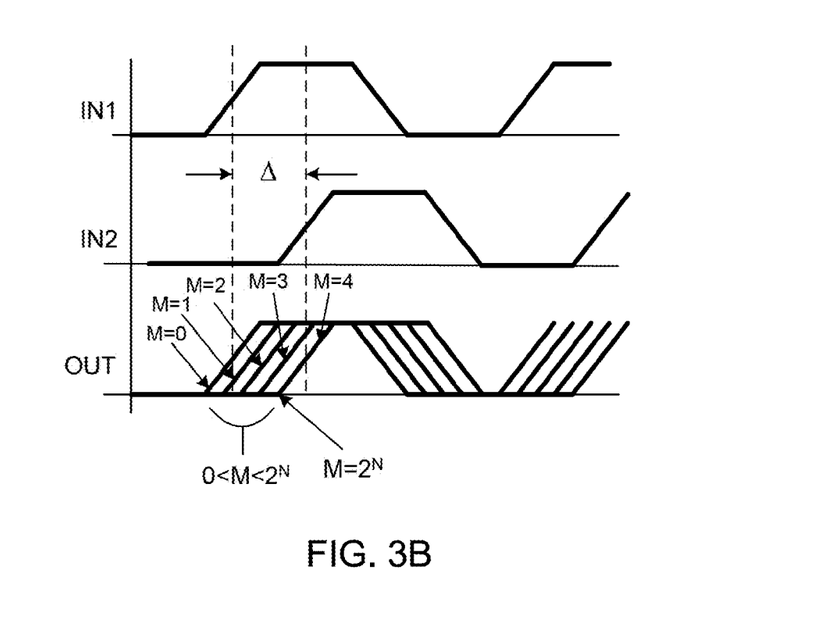
FIG. 3B depicts a timing diagram showing the interpolated fine-phase OUT signal from a DCEI for the general cases of M=0, 0<M<$2^N$, and M=$2^N$, and for an exemplary illustrative situation in which N=2.

FIG. 3B depicts a timing diagram showing the interpolated fine-phase OUT signal from a DCEI 108 for the general cases of M=0, $0<M<2^N$, and $M=2^N$. FIG. 3B also depicts a timing diagram for an exemplary illustrative situation in which N=2. For N=2, DCEI 108 comprises four interpolators 301. Additionally, there are four pairs of complementary signals $\overline{SW_i}$ and $SW_i$ driving switches 305 and 306. For this example of N=2, if M=0, the control signals $\overline{SW_i}$ applied to switches 305 will be 0000 and the control signals $SW_i$ applied to switches 306 will be 1111. For M=0, no interpolation needs to be performed, and inverters 302 of all four interpolators 301 are powered, whereas inverters 303 are unpowered. All four (powered) inverters 302 respond to the edge of IN1 and the interpolated fine-phase signal OUT corresponds to M=0 in FIG. 3B.

If M=1, the control signals $\overline{SW_i}$ applied to switches 305 will be, for example, 0001, and three inverters 302 of the four interpolators 301 are powered and respond to the edge of IN1, whereas one inverter 303 is powered and responds to the edge of IN2. The interpolated fine-phase signal OUT corresponds to M=1 in FIG. 3B.

If M=2, the control signals $\overline{SW_i}$ applied to switches 305 will be, for example, 0011, and two inverters 302 of the four interpolators 301 are powered and respond to the edge of IN1, whereas two inverters 303 are powered and respond to the edge of IN2. The interpolated fine-phase signal OUT corresponds to M=2 in FIG. 3B.

If M=3, the control signals $\overline{SW_i}$ applied to switches 305 will be, for example, 0111, and one inverter 302 of the four interpolators 301 is powered and responds to the edge of IN1, whereas three inverters 303 are powered and respond to the edge of IN2. The interpolated fine-phase signal OUT corresponds to M=3 in FIG. 3B.

Lastly, if M=4, the control signals $\overline{SW_i}$ applied to switches 305 will be, for example, 1111, and none of inverters 302 are powered and none respond to the edge of IN1, whereas four inverters 303 are powered and respond to the edge of IN2. The interpolated fine-phase signal OUT corresponds to M=4 in FIG. 3B.

Figure 3C:
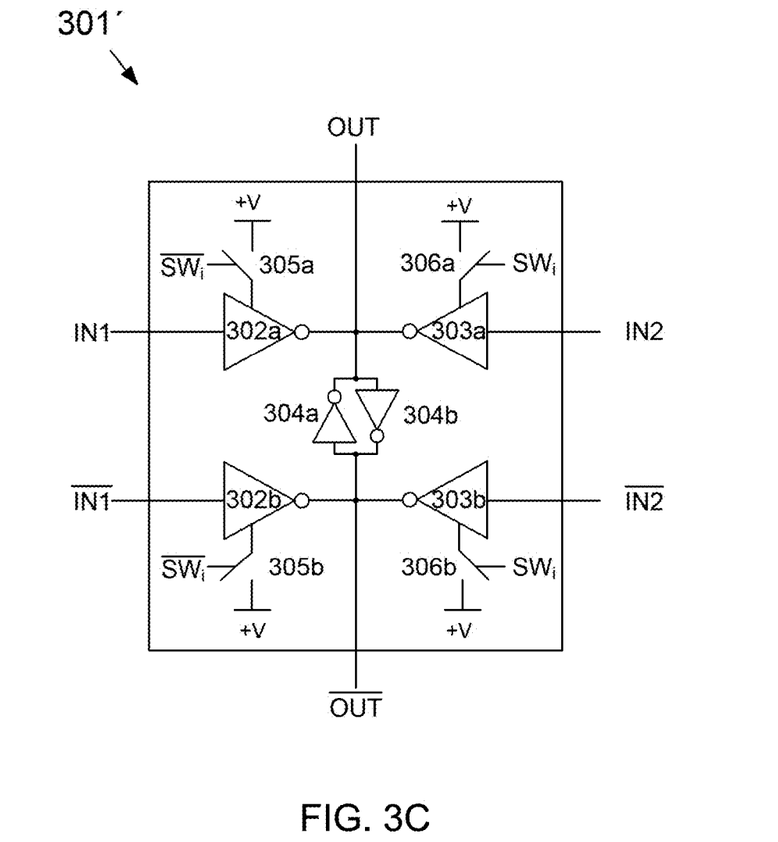
FIG. 3C depicts a functional block diagram of an exemplary embodiment of an interpolator configured for differential signals according to the subject matter disclosed herein.

FIG. 3C depicts a functional block diagram of an exemplary embodiment of an interpolator 301' configured for differential signals according to the subject matter disclosed herein. Differential interpolator 301' comprises a first pair of inverters 302a and 302b, and a second pair of inverters 303a and 303b. Differential inputs IN1 and $\overline{IN1}$ are respectively applied to the inputs to inverters 302a and 302b. Similarly, differential inputs IN2 and $\overline{IN2}$ are respectively applied to the inputs to inverters 303a and 303b. The outputs of inverters 302a, 302b, 303a and 303b are coupled to inverters 304a and 304b, which is configured to provide a differential interpolated fine-phase signal OUT and $\overline{OUT}$. Inverters 302a, 302b, 303a and 303b are coupled to power supply +V through switched 305a, 305b, 306a and 306b. Complementary differential control signals are applied to switches 305a and 305b, and to switches 306a and 306b. Although inverters 302a, 302b, 303a and 303b are depicted as being coupled to power supply voltage +V, it should be understood that the subject matter disclosed herein is not so limited and other power supplies and/or grounds could be controlled in a well-known manner to provide the functionality described, in addition to other well-known circuit configurations. It should also be understood that other well-known techniques could be alternatively used for controlling whether inverters 302a, 302b, 303a and 303b are responsive to the IN1, $\overline{IN1}$, IN2 and $\overline{IN2}$ input signals. It should be understood that the subject matter disclosed herein is not so limited and interpolators 301' could be configured for a positive logic arrangement.

Figure 4:
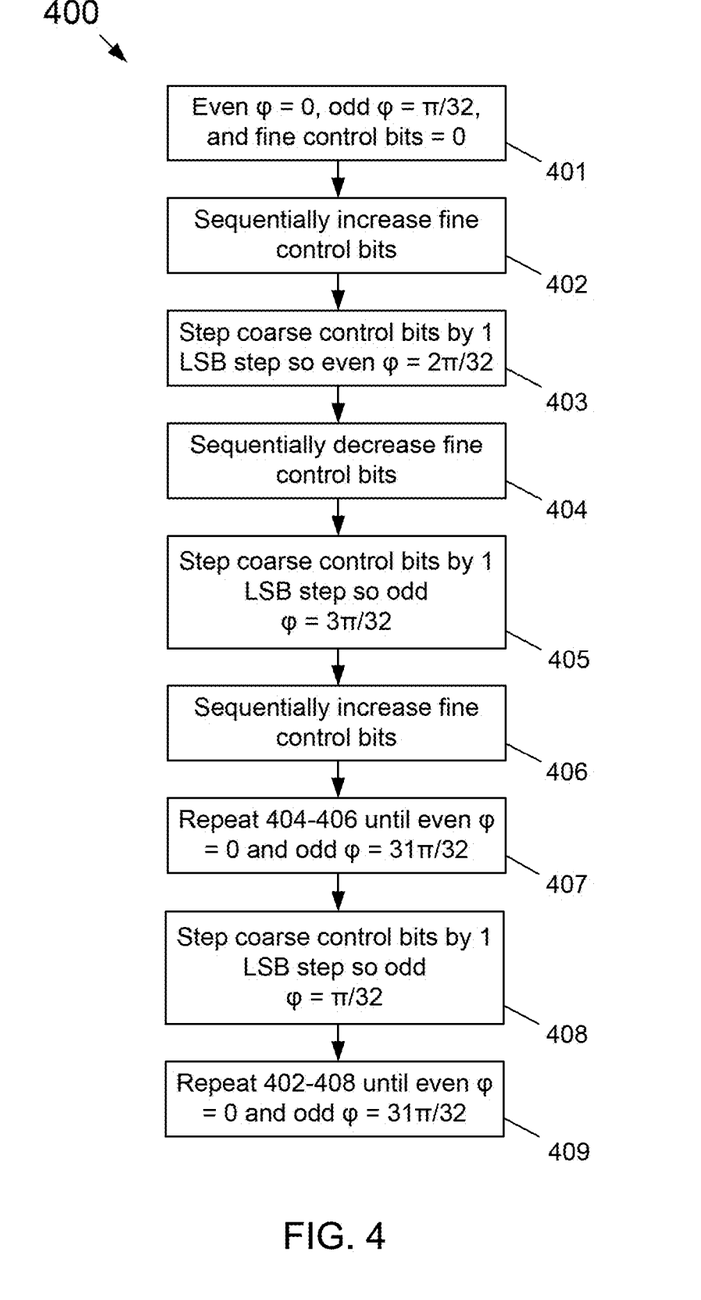
FIG. 4 depicts an exemplary illustrative sequence of operation for the exemplary embodiment of DTC depicted in FIGS. 1, 2, 3A and 3C.

FIG. 4 depicts an exemplary illustrative code ramp sequence of operation 400 for the exemplary embodiments of DTC 100 depicted in FIGS. 1, 2, 3A and 3C. At 401, even phase starts at φ=0 and odd phase at φ=π/32. Additionally, the fine control bits for this explanation all start at 0 so that all interpolators 301 are responsive to the even phase input to IN1. At 402, fine bits are sequentially increased until all fine control bits are at 1, in which case interpolators 301 are all responsive to the odd phase input to IN2. At 403, the coarse control bits input to Even MUX 107E are stepped by one LSB step (e.g., from φ=0 to φ=2π/32). At this point, no interpolators 301 are responsive to even phase at input IN1, so the output of DCEI 108 is not impacted by the phase step of Even MUX 107E. At 404, the fine control bits are now decreased back sequentially to all being 0 so that all interpolators 301 are responsive to IN1. At 405, odd Phase MUX 204 is then stepped by one phase step from φ=π/32 to φ=3π/32. At this point, no interpolators 301 are responsive to the odd phase input to IN2, and the output of DECI 108 is not impacted by the phase step of Odd MUX 107O. At 406, the fine control bits are then increased until all fine control bits are at 1 (e.g., all interpolators 301 are responsive to the odd phase input to IN2). At 407, the sequence is repeated until Even Phase MUX 107E is φ=0 and Odd Phase MUX 107O is φ=31π/32. At 408, when all fine control bits are decreased to 0, the odd phase can be stepped from φ=31π/32 to φ=π/32, and the sequence is repeated at 409. Although the exemplary sequence of operation depicted in FIG. 4 starts at even phase φ=0 and odd phase at φ=π/32, it should be understood that the subject matter disclosed herein is not so limited and could start at any two adjacent even and odd coarse phases and/or it should be understood that the sequence of operation could start with an odd coarse phase.

Two things should be noted about the subject matter disclosed herein. First, DCEI 108 is configured so that the interpolated fine-phase signal OUT fully covers the range between IN1 and IN2; consequently, the interpolated fine-phase signal OUT is self-aligned with each respective tap and no calibration technique is required to align coarse and fine DTC segments. Moreover, even if some mismatch exists between individual course delays/phases, the subject matter disclosed herein assures monotonicity of the phase, and full and exact coverage of 2π. Any phase nonlinearity in the output of a DCEI caused by the control bit code can be corrected by using well-known pre-distortion techniques. Second, the stepping of the coarse bits between odd/even assures continuous rollover of the coarse phases because each phase has one MUX path and does not change MUX path when the coarse bits rollover.

Figure 5A:
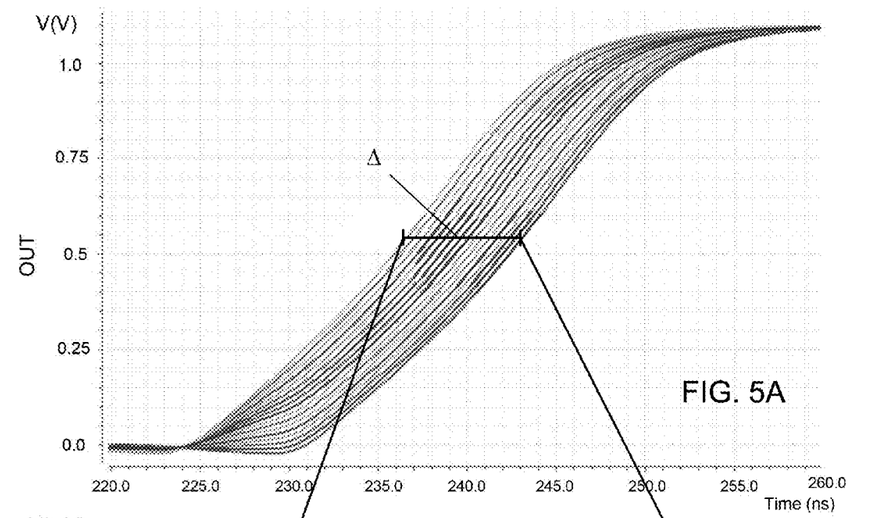
FIGS. 5A and 5B depict the expected fine-phase signal OUT for the full coverage of a Δ step for a rising edge of a 2.4 GHz carrier for two phases separated by 2π/64 (e.g., Δ=6.51 ps) for an exemplary DCEI comprising 512 interpolators.
Figure 5B:
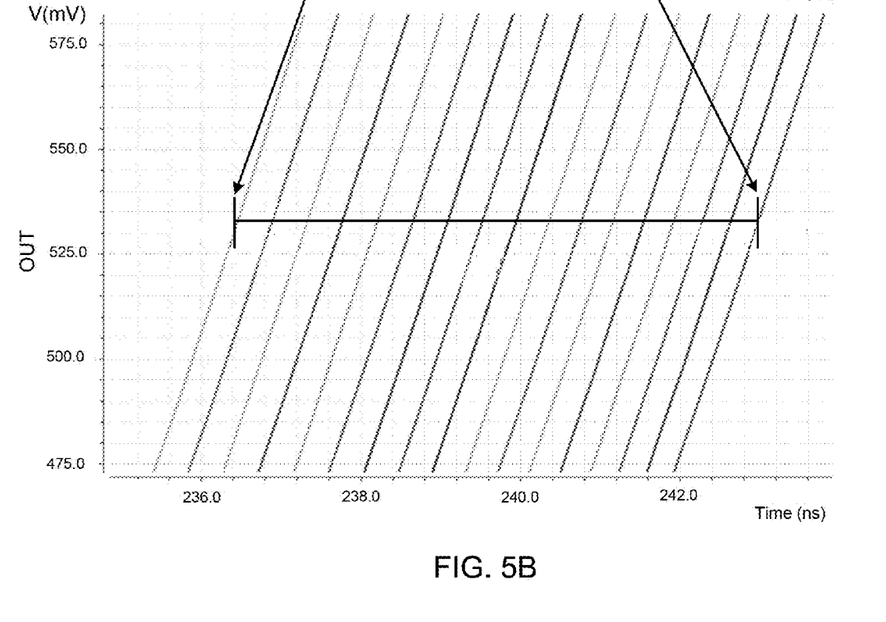

FIGS. 5-7 depict simulation results of an exemplary DCEI comprising 512 interpolators. In particular, FIG. 5A depicts the expected fine-phase signal OUT for the full coverage of a Δ step for a rising edge of a 2.4 GHz carrier for two phases separated by 2π/64 (e.g., Δ=6.51 ps). FIG. 5B shows the full coverage of the Δ step of FIG. 5A in greater detail.

Figure 6:
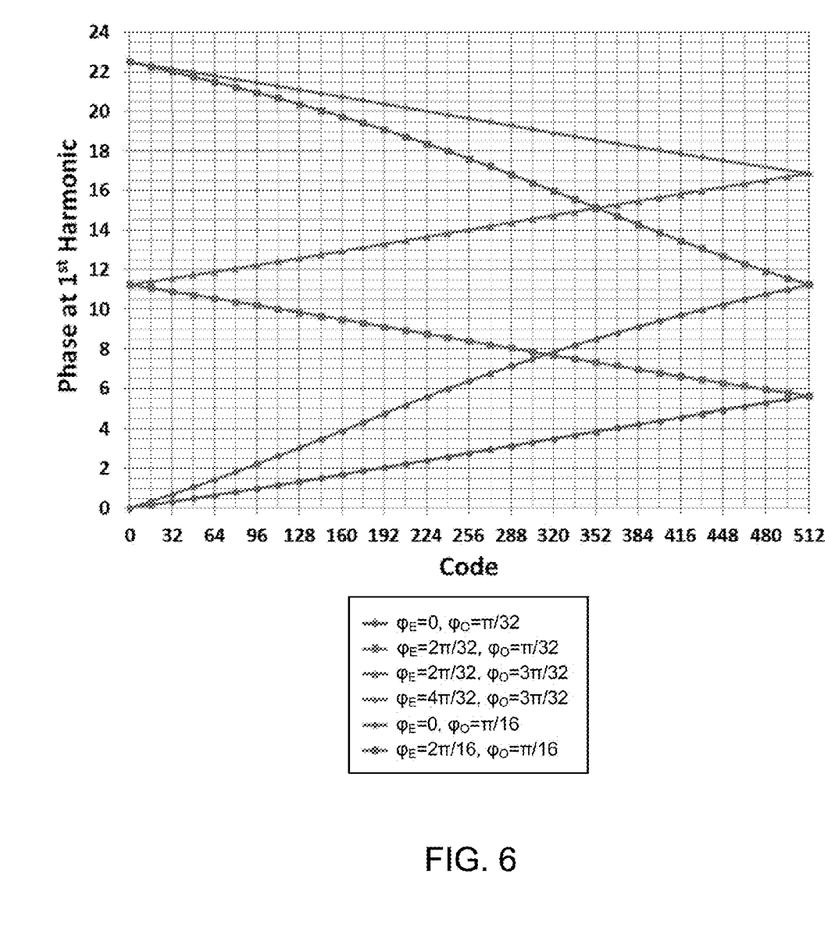
FIG. 6 depicts simulation results for the phase shift at the first harmonic for a 2.4 GHz carrier as a function of two coarse phase steps between 2π/64 and 2π/32 at the input of a DCEI and 512 fine DCEI control bit steps between the two coarse phase steps.

FIG. 6 depicts simulation results for the phase shift at the first harmonic for a 2.4 GHz carrier as a function of two coarse phase steps between 2π/64 and 2π/32 at the input of a DCEI and 512 fine DCEI control bit steps between the two coarse phase steps. In particular, FIG. 6 shows contiguous operation of the subject matter disclosed herein and that a wide range of input steps can be easily handled, thereby easily handling mismatch effects in coarse bits.

Figure 7:
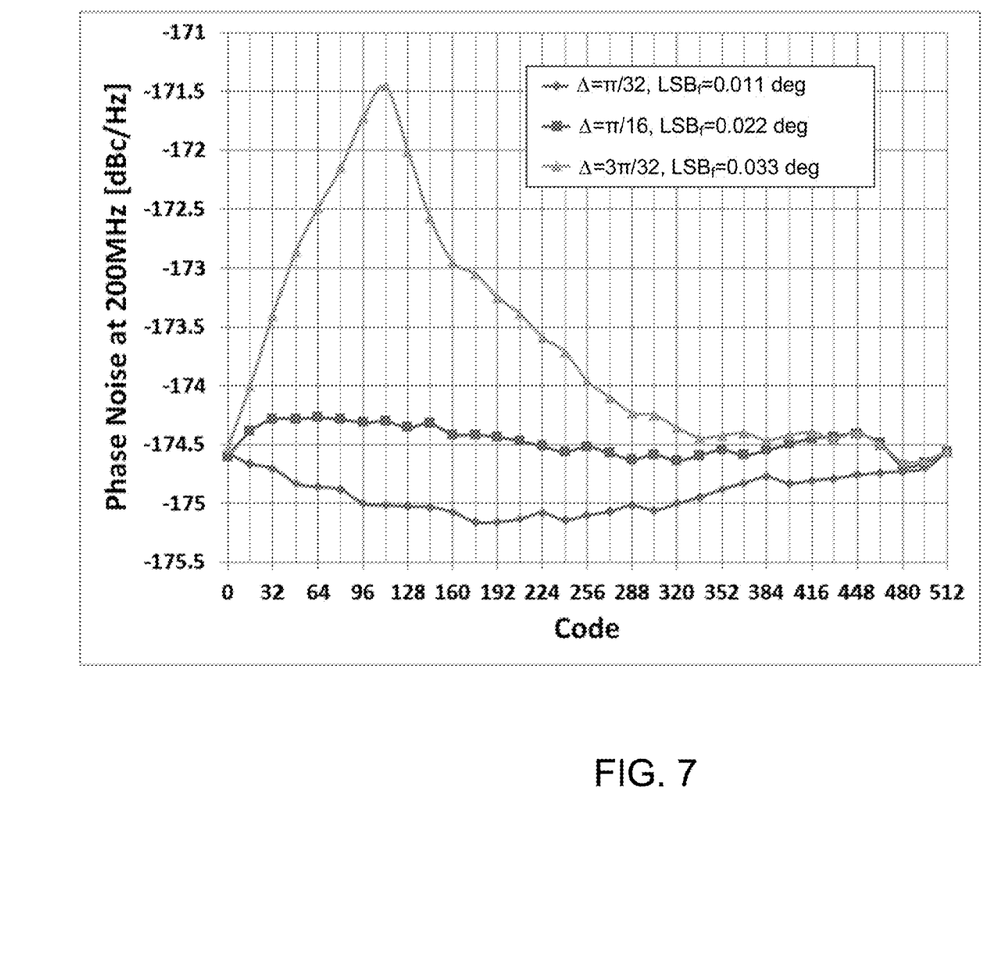
FIG. 7 depicts simulation results for jitter and phase noise at 200 MHz from a 2.4 GHz carrier for three coarse phase steps at the input of a DCEI and 512 fine DCEI control bit steps.

FIG. 7 depicts simulation results for jitter and phase noise at 200 MHz from a 2.4 GHz carrier for three coarse phase steps at the input of a DCEI and 512 fine DCEI control bit steps. In particular, FIG. 7 shows that a DCEI according to the subject matter disclosed herein provides a noise floor that allows good co-existence capabilities.

Figure 8:
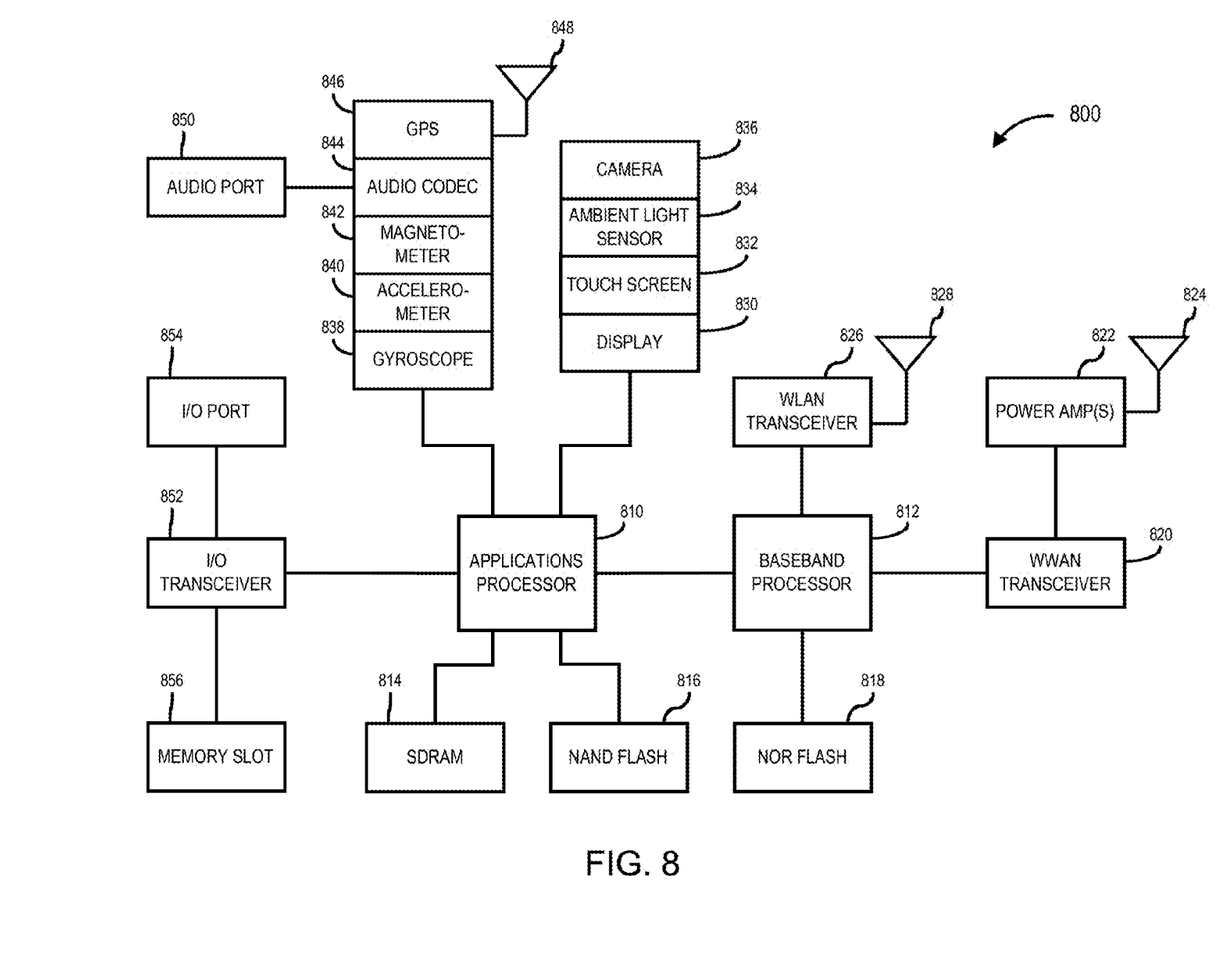
FIG. 8 depicts an exemplary functional block diagram of an information-handling system according to the subject matter disclosed herein.

FIG. 8 depicts an exemplary functional block diagram of an information-handling system 800 according to the subject matter disclosed herein. Information-handling system 800 of FIG. 8 may tangibly embody one or more Digital Polar Transmitter (DPTX) devices that comprises a Digital-to-Time Converter (DTC) that includes a digitally controlled edge interpolator (DCEI) for generating fine delay/phase signals that are self-aligned with a coarse delay/phase segment and that does not need coarse/fine alignment calibration techniques according to the subject matter disclosed herein. In one exemplary embodiment, information-handling system 800 may comprise a mobile-type device or information-handling system capable of wirelessly communicating via a wireless network, such as, but not limited to, a notebook-type computer, a cellular telephone, a personal digital assistant, an M2M-type device, or the like. Although information-handling system 800 represents one example of several types of computing platforms, information-handling system 800 may include more or fewer elements and/or different arrangements of elements than shown in FIG. 8, and the scope of the claimed subject matter is not limited in these respects.

In one or more embodiments, information-handling system 800 may comprise one or more applications processor 810 and a baseband processor 812. Applications processor 810 may be utilized as a general purpose processor to run applications and the various subsystems for information handling system 800, and for controlling a Digital-to-Time Converter (DTC) comprising a digitally controlled edge interpolator (DCEI) for generating fine delay/phase signals that are self-aligned with a coarse delay/phase segment and that does not need coarse/fine alignment calibration techniques according to the subject matter disclosed herein. Applications processor 810 may include a single core or alternatively may include multiple processing cores wherein one or more of the cores may comprise a digital signal processor or digital signal processing core. Furthermore, applications processor 810 may include a graphics processor or coprocessor disposed on the same chip, or alternatively a graphics processor coupled to applications processor 810 may comprise a separate, discrete graphics chip. Applications processor 810 may include onboard memory, such as cache memory, and further may be coupled to external memory devices such as synchronous dynamic random access memory (SDRAM) 814 for storing and/or executing applications, such as capable of controlling a Digital-to-Time Converter (DTC) comprising a digitally controlled edge interpolator (DCEI) for generating fine delay/phase signals that are self-aligned with a coarse delay/phase segment and that does not need coarse/fine alignment calibration techniques according to the subject matter disclosed herein. During operation, and NAND flash 816 for storing applications and/or data even when information handling system 800 is powered off.

In one exemplary embodiment, a list of candidate nodes may be stored in SDRAM 814 and/or NAND flash 816. Further, applications processor 810 may execute computer-readable instructions stored in SDRAM 814 and/or NAND flash 816 that result controlling a Digital-to-Time Converter (DTC) comprising a digitally controlled edge interpolator (DCEI) for generating fine delay/phase signals that are self-aligned with a coarse delay/phase segment and that does not need coarse/fine alignment calibration techniques according to the subject matter disclosed herein.

In one exemplary embodiment, baseband processor 812 may control the broadband radio functions for information-handling system 800. Baseband processor 812 may store code for controlling such broadband radio functions in a NOR flash 818. Baseband processor 812 controls a wireless wide area network (WWAN) transceiver 820 which is used for modulating and/or demodulating broadband network signals, for example, for communicating via an IEEE 802.11 ac network, a 3GPP LTE network and/a 4GPP LTE network or the like as discussed herein with respect to FIG. 8. The WWAN transceiver 820 couples to one or more power amplifiers 822 that are respectively coupled to one or more antennas 824 for sending and receiving radio-frequency signals via the WWAN broadband network. In an exemplary embodiment, one or more of power amplifiers 822 comprise a digital polar transmitter that comprise a Digital-to-Time Converter (DTC) that includes a digitally controlled edge interpolator (DCEI) according to the subject matter disclosed herein. The baseband processor 812 also may control a wireless local area network (WLAN) transceiver 826 coupled to one or more suitable antennas 828 and that may be capable of communicating via a Bluetooth-based standard, an IEEE 802.11-based standard, an IEEE 802.16-based standard, an IEEE 802.18-based wireless network standard, a 3GPP-based protocol wireless network, a Third Generation Partnership Project Long Term Evolution (3GPP LTE) based wireless network standard, a 3GPP2 Air Interface Evolution (3GPP2 AIE) based wireless network standard, a 3GPP-LTE-Advanced-based wireless network, a UMTS-based protocol wireless network, a CDMA2000-based protocol wireless network, a GSM-based protocol wireless network, a cellular-digital-packet-data-based (CDPD-based) protocol wireless network, a Mobitex-based protocol wireless network, a Near-Field-Communications-based (NFC-based) link, a WiGig-based network, a ZigBee-based network, or the like. It should be noted that these are merely exemplary implementations for applications processor 810 and baseband processor 812, and the scope of the claimed subject matter is not limited in these respects. For example, any one or more of SDRAM 814, NAND flash 816 and/or NOR flash 818 may comprise other types of memory technology, such as magnetic-based memory, chalcogenide-based memory, phase-change-based memory, optical-based memory, or ovonic-based memory, and the scope of the claimed subject matter is not limited in this respect.

In one or more embodiments, applications processor 810 may drive a display 830 for displaying various information or data, and may further receive touch input from a user via a touch screen 832, for example, via a finger or a stylus. In one exemplary embodiment, screen 832 display a menu and/or options to a user that are selectable via a finger and/or a stylus for entering information into information-handling system 800.

An ambient light sensor 834 may be utilized to detect an amount of ambient light in which information-handling system 800 is operating, for example, to control a brightness or contrast value for display 830 as a function of the intensity of ambient light detected by ambient light sensor 834. One or more cameras 836 may be utilized to capture images that are processed by applications processor 810 and/or at least temporarily stored in NAND flash 816. Furthermore, applications processor may be coupled to a gyroscope 838, accelerometer 840, magnetometer 842, audio coder/decoder (CODEC) 844, and/or global positioning system (GPS) controller 846 coupled to an appropriate GPS antenna 848, for detection of various environmental properties including location, movement, and/or orientation of information-handling system 800. Alternatively, controller 846 may comprise a Global Navigation Satellite System (GNSS) controller. Audio CODEC 844 may be coupled to one or more audio ports 850 to provide microphone input and speaker outputs either via internal devices and/or via external devices coupled to information-handling system via the audio ports 850, for example, via a headphone and microphone jack. In addition, applications processor 810 may couple to one or more input/output (I/O) transceivers 852 to couple to one or more I/O ports 854 such as a universal serial bus (USB) port, a high-definition multimedia interface (HDMI) port, a serial port, and so on. Furthermore, one or more of the I/O transceivers 852 may couple to one or more memory slots 856 for optional removable memory, such as secure digital (SD) card or a subscriber identity module (SIM) card, although the scope of the claimed subject matter is not limited in these respects.

Figure 9:
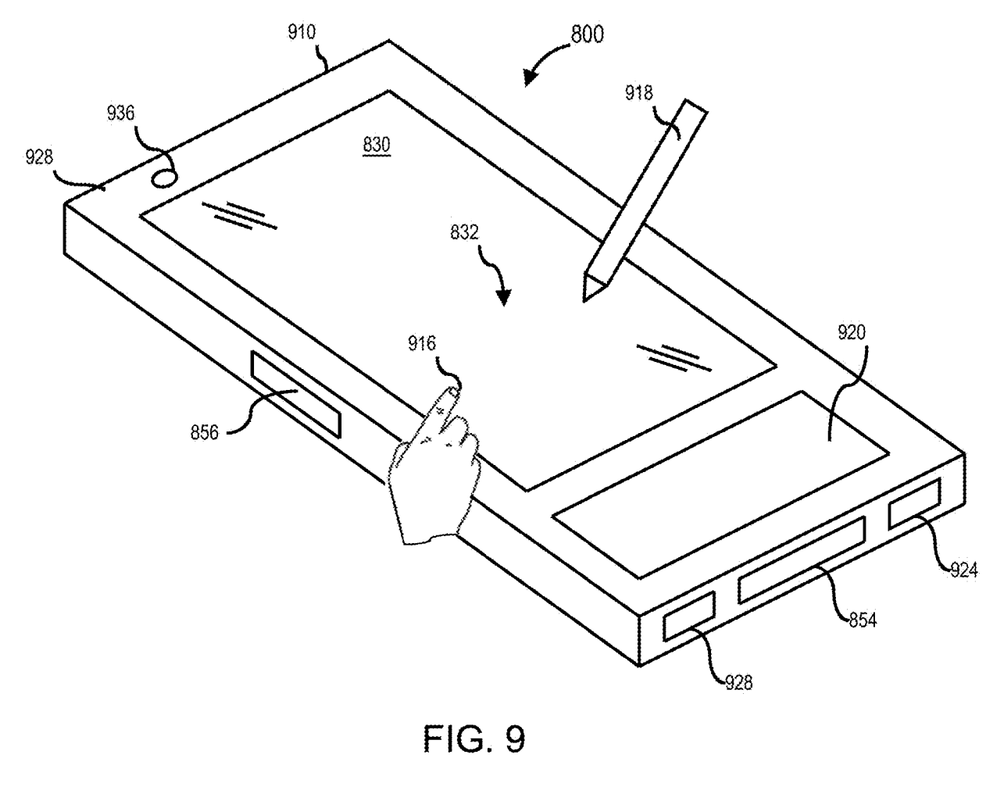
FIG. 9 depicts an isometric view of an exemplary embodiment of the information-handling system of FIG. 8 that optionally may include a touch screen in accordance with one or more embodiments disclosed herein.

FIG. 9 depicts an isometric view of an exemplary embodiment of the information-handling system of FIG. 8 that optionally may include a touch screen in accordance with one or more embodiments disclosed herein. FIG. 9 shows an example implementation of information-handling system 800 of FIG. 8 tangibly embodied as a cellular telephone, smartphone, smart-type device, or tablet-type device or the like, that may comprise one or more Digital Polar Transmitter (DPTX) devices comprising a Digital-to-Time Converter (DTC) that includes a digitally controlled edge interpolator (DCEI) for generating fine delay/phase signals that are self-aligned with a coarse delay/phase segment and that does not need coarse/fine alignment calibration techniques according to the subject matter disclosed herein. The information-handling system 800 may comprise a housing 910 having a display 830 that may include a touch screen 832 for receiving tactile input control and commands via a finger 916 of a user and/or a via stylus 918 to control one or more applications processors 810. The housing 910 may house one or more components of information-handling system 800, for example, one or more applications processors 810, one or more of SDRAM 814, NAND flash 816, NOR flash 818, baseband processor 812, and/or WWAN transceiver 820. The information-handling system 800 further may optionally include a physical actuator area 920 that may comprise a keyboard or buttons for controlling information-handling system 800 via one or more buttons or switches. The information-handling system 800 may also include a memory port or slot 856 for receiving non-volatile memory, such as flash memory, for example, in the form of a secure digital (SD) card or a subscriber identity module (SIM) card. Optionally, the information-handling system 800 may further include one or more speakers and/or microphones 924 and a connection port 854 for connecting the information-handling system 800 to another electronic device, dock, display, battery charger, and so on. Additionally, information-handling system 800 may include a headphone or speaker jack 928 and one or more cameras 836 on one or more sides of the housing 910. It should be noted that the information-handling system 800 of FIGS. 8 and 9 may include more or fewer elements than shown, in various arrangements, and the scope of the claimed subject matter is not limited in this respect.

Figure 10:
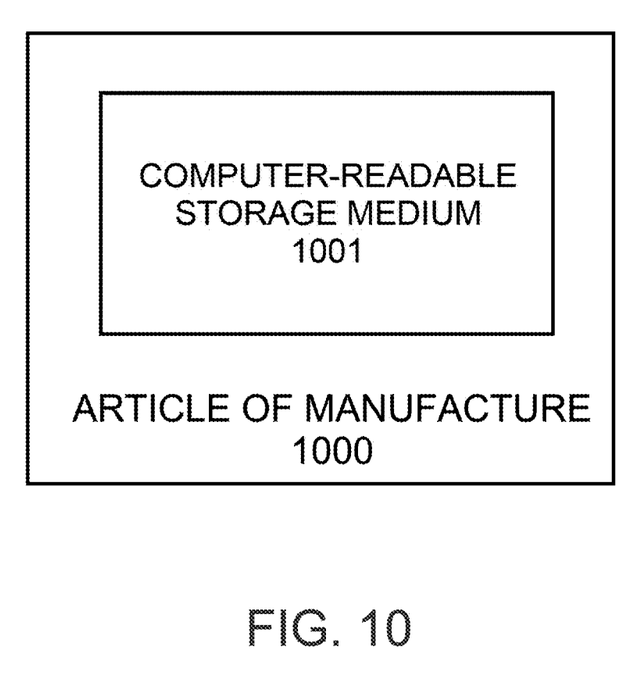
FIG. 10 depicts an exemplary embodiment of an article of manufacture comprising a non-transitory computer-readable storage medium having stored thereon computer-readable instructions that, when executed by a computer-type device, results in any of the various techniques and methods according to the subject matter disclosed herein.

FIG. 10 depicts an exemplary embodiment of an article of manufacture 1000 comprising a non-transitory computer-readable storage medium 1001 having stored thereon computer-readable instructions that, when executed by a computer-type device, results in any of the various techniques and methods according to the subject matter disclosed herein. Exemplary computer-readable storage mediums that could be used for computer-readable storage medium 1001 could be, but are not limited to, a semiconductor-based memory, an optically based memory, a magnetic-based memory, or a combination thereof.

These modifications can be made in light of the above detailed description. The terms used in the following claims should not be construed to limit the scope to the specific embodiments disclosed in the specification and the claims. Rather, the scope of the embodiments disclosed herein is to be determined by the following claims, which are to be construed in accordance with established doctrines of claim interpretation.

The invention claimed is:

1. A digital-to-time converter (DTC), comprising:
a coarse phase segment generating a coarse phase signal, the coarse phase signal comprising an even phase signal and an odd phase signal; and
a digitally controlled edge interpolator comprising a fine phase segment comprising an even coarse phase input and an odd coarse phase input, the even coarse phase input receiving the even coarse phase signal, the odd coarse phase input receiving the odd coarse phase signal, the fine phase segment responsive to a fine phase control signal to generate a fine phase output signal that is an interpolation of the even phase signal and the odd phase signal;
wherein the digitally controlled edge interpolator comprises an array of inverters having inputs fed by at least two or more adjacent coarse delay signals from the coarse phase segment to provide the fine phase output signal that is an interpolation of the even phase signal and the odd phase signal.

2. The DTC according to claim 1, wherein the fine phase control signal comprises a binary signal having $2^N$ values in which N comprises an integer equal to or greater than 2, and
wherein the fine phase segment further comprises $2^N$ interpolators, each interpolator being coupled to the even coarse phase signal and the odd coarse phase signal and being controlled by the fine phase control signal to be responsive to the even coarse phase signal or the odd coarse phase signal based on a value of the fine phase control signal, an output of each interpolator being coupled together to form the fine phase output signal.

3. The DTC according to claim 2, wherein if a value M of the fine phase control signal equals 0 (M=0), then all interpolators are responsive to the even coarse phase signal,
wherein if $0<M<2^N$, then M interpolators are responsive to the even coarse phase signal and $2^N-M$ interpolators are responsive to the odd coarse phase signal; and
wherein if $M=2^N$, then all $2^N$ interpolators are responsive to the odd coarse phase signal.

4. The DTC according to claim 2, wherein if a value M of the fine phase control signal equals 0, then all interpolators are responsive to the odd coarse phase signal,
wherein if $0<M<2^N$, then M interpolators are responsive to the odd coarse phase signal and $2^N-M$ interpolators are responsive to the even coarse phase signal; and
wherein if $M=2^N$, then all $2^N$ interpolators are responsive to the even coarse phase signal.

5. The DTC according to claim 1, wherein the fine phase output signal is a phase modulation signal for a digital polar transmitter signal.

6. The DTC according to claim 1, wherein the DTC comprises part of a digital polar transmitter (DPT).

7. The DTC according to claim 6, wherein the digital polar transmitter comprises part of a cellular telephone, smartphone, smart-type device, or tablet-type device.

8. The DTC according to claim 7, wherein the cellular telephone, smartphone, smart-type device, or tablet-type device further comprises a touchscreen display capable of receiving input information from a touch of a user or a stylus.

9. A digital polar transmitter, comprising:
a digital-to-time converter (DTC), comprising a coarse phase segment and a digitally controlled edge interpolator comprising a fine phase segment, the coarse phase segment generating an even phase signal and an odd phase signal from a local oscillator signal, the fine phase segment receiving the even coarse phase signal and the odd coarse phase signal, and the fine phase segment responsive to a fine phase control signal to generate a fine phase signal output signal that is an interpolation of the even phase signal and the odd phase signal;
wherein the digitally controlled edge interpolator comprises an array of inverters having inputs fed by at least two or more adjacent coarse delay signals from the coarse phase segment to provide the fine phase output signal that is an interpolation of the even phase signal and the odd phase signal; and
a digital power amplifier coupled to the fine phase output signal and receiving an amplitude modulation signal, the digital power amplifier being responsive to the fine phase signal and the amplitude modulation signal to output an amplitude- and phase-modulated signal to be transmitted, the fine phase output signal comprising a phase modulation signal for the digital polar transmitter.

10. The digital polar transmitter according to claim 9, wherein the fine phase control signal comprises a binary signal having $2^N$ values in which N comprises an integer equal to or greater than 2, and
wherein the fine phase segment further comprises $2^N$ interpolators, each interpolator being coupled to the even coarse phase signal and the odd coarse phase signal and being controlled by the fine phase control signal to be responsive to the even coarse phase signal or the odd coarse phase signal based on a value of the fine phase control signal, an output of each interpolator being coupled together to form the fine phase output signal.

11. The digital polar transmitter according to claim 10, wherein if a value M of the fine phase control signal equals 0 (M=0), then all interpolators are responsive to the even coarse phase signal,
wherein if $0<M<2^N$, then M interpolators are responsive to the even coarse phase signal and $2^N-M$ interpolators are responsive to the odd coarse phase signal; and
wherein if $M=2^N$, then all $2^N$ interpolators are responsive to the odd coarse phase signal.

12. The digital polar transmitter according to claim 10, wherein if a value M of the fine phase control signal equals 0, then all interpolators are responsive to the odd coarse phase signal,
wherein if $0<M<2^N$, then M interpolators are responsive to the odd coarse phase signal and $2^N-M$ interpolators are responsive to the even coarse phase signal; and
wherein if $M=2^N$, then all $2^N$ interpolators are responsive to the even coarse phase signal.

13. The digital polar transmitter according to claim 12, wherein the digital polar transmitter comprises part of a digital polar transmitter (DPT).

14. The digital polar transmitter according to claim 13, wherein the digital polar transmitter comprises part of a cellular telephone, smartphone, smart-type device, or tablet-type device.

15. The digital polar transmitter according to claim 14, wherein the cellular telephone, smartphone, smart-type device, or tablet-type device further comprises a touchscreen display capable of receiving input information from a touch of a user or a stylus.

16. A method to generate a fine phase signal for a digital-to-time (DTC) converter of a digital polar transmitter, the method comprising:
generating a coarse phase signal comprising an even phase signal and an odd phase signal; and
generating, with a digitally controlled edge interpolator, a fine phase output signal that is an interpolation of the even phase signal and the odd phase signal based on a fine phase control signal, the fine phase control signal comprising a binary signal having $2^N$ values in which N comprises an integer equal to or greater than 2, the fine phase output signal comprising a phase modulation signal for a digital polar transmitter signal,
wherein said generating the fine phase output signal comprises feeding at least two or more adjacent coarse delay signals to the digitally controlled edge interpolator to provide the fine phase output signal that is an interpolation of the even phase signal and the odd phase signal.

17. The method according to claim 16, wherein generating the fine phase output signal comprises controlling $2^N$ interpolators with the fine phase control signal, each interpolator being coupled to the even coarse phase signal and the odd coarse phase signal and being controlled by the fine phase control signal to be responsive to the even coarse phase signal or the odd coarse phase signal based on a value of the fine phase control signal, an output of each interpolator being coupled together to form the fine output signal.

18. The method according to claim 17, wherein if a value M of the fine phase control signal equals 0 (M=0), then all interpolators are responsive to the even coarse phase signal,
wherein if $0<M<2^N$, then M interpolators are responsive to the even coarse phase signal and $2^N-M$ interpolators are responsive to the odd coarse phase signal; and
wherein if $M=2^N$, then all $2^N$ interpolators are responsive to the odd coarse phase signal.

19. The method according to claim 17, wherein if a value M of the fine phase control signal equals 0, then all interpolators are responsive to the odd coarse phase signal,
wherein if $0<M<2^N$, then M interpolators are responsive to the odd coarse phase signal and $2^N-M$ interpolators are responsive to the even coarse phase signal; and
wherein if $M=2^N$, then all $2^N$ interpolators are responsive to the even coarse phase signal.

20. An information-handling system, comprising:
a processor and a memory coupled to the processor; and
a radio-frequency transceiver coupled to the processor, the radio-frequency transceiver comprising a digital polar transmitter comprising a digital power amplifier and a digital-to-time converter (DTC), the DTC comprising:
a coarse phase segment generating a coarse delay/phase signal, the coarse phase signal comprising an even delay/phase signal and an odd phase signal; and
a digitally controlled edge interpolator comprising a fine phase segment comprising an even coarse phase input and an odd coarse phase input, the even coarse phase input receiving the even coarse phase signal, the odd coarse phase input receiving the odd coarse phase signal, the fine phase segment responsive to a fine phase control signal to generate a fine phase output signal that is an interpolation of the even phase signal and the odd phase signal, and the fine phase output signal comprising a phase modulation signal for a digital polar transmitter signal;
wherein the digitally controlled edge interpolator comprises an array of inverters having inputs fed by at least two or more adjacent coarse delay signals from the coarse phase segment to provide the fine phase output signal that is an interpolation of the even phase signal and the odd phase signal.

21. The information-handling system according to claim 20, wherein the fine phase control signal comprises a binary signal having $2^N$ values in which N comprises an integer equal to or greater than 2, and
wherein the fine phase segment further comprises $2^N$ interpolators, each interpolator being coupled to the even coarse phase signal and the odd coarse phase signal and being controlled by the fine phase control signal to be responsive to the even coarse phase signal or the odd coarse phase signal based on a value of the fine phase control signal, an output of each interpolator being coupled together to form the fine phase output signal.

22. The information-handling system according to claim 21, wherein if a value M of the fine phase control signal equals 0 (M=0), then all interpolators are responsive to the even coarse phase signal,
wherein if $0<M<2^N$, then M interpolators are responsive to the even coarse phase signal and $2^N-M$ interpolators are responsive to the odd coarse phase signal; and
wherein if $M=2^N$, then all $2^N$ interpolators are responsive to the odd coarse phase signal.

23. The information-handling system according to claim 21, wherein if a value M of the fine phase control signal equals 0, then all interpolators are responsive to the odd coarse phase signal,
wherein if $0<M<2^N$, then M interpolators are responsive to the odd coarse phase signal and $2^N-M$ interpolators are responsive to the even coarse phase signal; and
wherein if $M=2^N$, then all $2^N$ interpolators are responsive to the even coarse phase signal.

24. The information-handling system according to claim 20, wherein the information-handling system comprises a cellular telephone, smartphone, smart-type device, or tablet-type device.

25. The information-handling system according to claim 24, wherein the cellular telephone, smartphone, smart-type device, or tablet-type device further comprises a touchscreen display capable of receiving input information from a touch of a user or a stylus.

* * * * *